United States Patent [19]

Takemae et al.

[11] Patent Number: 4,771,407
[45] Date of Patent: Sep. 13, 1988

[54] SEMICONDUCTOR INTEGRATED CIRCUIT HAVING FUNCTION FOR SWITCHING OPERATIONAL MODE OF INTERNAL CIRCUIT

[75] Inventors: Yoshihiro Takemae, Tokyo; Shigeki Nozaki, Kuwana; Masao Nakano, Kasugai; Kimiaki Sato, Tokyo; Hatsuo Miyahara, Yame; Nobumi Kodama; Makoto Yanagisawa, both of Kawasaki; Yasuhiro Takada, Yokohama; Satoshi Momozono, Mizusawa, all of Japan

[73] Assignee: Fujitsu Limited, Kawasaki, Japan

[21] Appl. No.: 79,061

[22] Filed: Jul. 29, 1987

[30] Foreign Application Priority Data

Aug. 1, 1986 [JP] Japan ................................ 61-179840

[51] Int. Cl.$^4$ ............................................. G11C 11/40
[52] U.S. Cl. .................................... 365/226; 365/189; 371/21; 371/66
[58] Field of Search ............... 365/189, 226, 227, 230, 365/233; 371/21, 66

[56] References Cited

U.S. PATENT DOCUMENTS 4,709,354 11/1987 Ichinose et al. ..................... 365/226

FOREIGN PATENT DOCUMENTS 61-258399 11/1986 Japan .

Primary Examiner—Terrell W. Fears
Attorney, Agent, or Firm—Armstrong, Nikaido, Marmelstein & Kubovcik

[57] ABSTRACT

In a semiconductor integrated circuit having first and second power supply lines for receiving a power supply voltage, an external input terminal for receiving an input signal, and a high voltage detection circuit for detecting at the external input terminal a high voltage higher than a predetermined voltage which is higher than the power supply voltage, the high voltage detection circuit comprises an input circuit connected to the external input terminal for generating circuit for generating a reference voltage; and a differential voltage amplifier connected to receive the detection voltage and the reference voltage for amplifying the difference between the detection voltage and the reference voltage, to thereby determine whether the high voltage is applied, the input circuit comprising; a level shift element connected to the external input terminal for providing the detection voltage; an impedance element connected between the level shift element and the second power supply line; and a leak current compensating element connected between the first power supply line and the level shift element for allowing a current to flow from the first power supply line through the leak current compensating element and the impedance element to the second power supply line when the high voltage is not applied to the external input terminal.

13 Claims, 6 Drawing Sheets

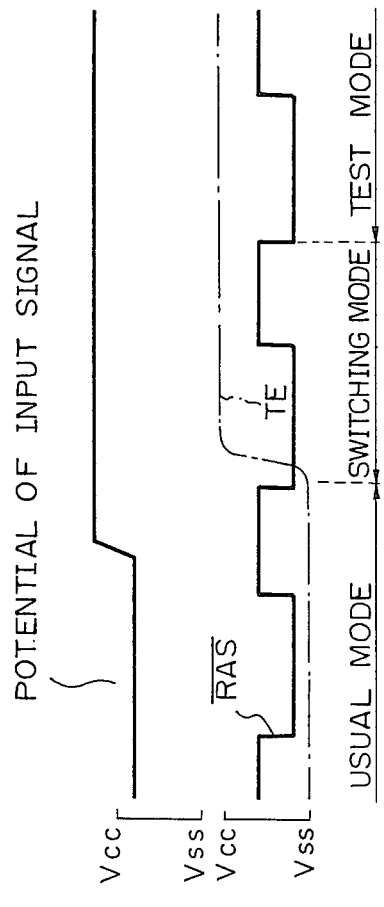

SEMICONDUCTOR INTEGRATED CIRCUIT HAVING FUNCTION FOR SWITCHING OPERATIONAL MODE OF INTERNAL CIRCUIT

BACKGROUND OF THE INVENTION (1) Field of the Invention

The present invention relates to a semiconductor integrated circuit able to switch the operational mode of an internal circuit. More particularly, it relates to a semiconductor integrated circuit comprising a memory cell array which can be switched from a usual mode to a test mode, or vice versa, in accordance with the potential value of an input signal supplied from an external input terminal.

(2) Description of the Related Art

Recently, the capacity of a memory cell array has been increased and when a memory cell array having a large capacity (e.g., 1 (mega words)×1 (bit)) is tested, the time needed for successively writing test data to each of the memory cells, and for successively reading test data from each of the memory cells, is increased. For example, if a test of a dynamic RAM having the above capacity and a cycle time of about 260 nano seconds is carried out using a March pattern (a well known test pattern), a test time of about 3.2 seconds is needed for carrying out the above test. Also, the test time is further increased according to the increase of the kinds of tests needed, and accordingly, the cost of carrying out these tests is also increased.

Thus, in order to test a memory cell array having a large capacity within a comparatively short time, the memory cell array is divided into several memory blocks, and each memory block is connected to a data input terminal and a data output terminal through a functional block for usual operation, which functions when the memory cell array operates in a usual mode, and a functional block for testing which functions when the memory cell array operates in a test mode. The functional block for a usual operation usually comprises a decoder for selecting one of the memory blocks.

Thus, in a write mode, predetermined write data is written to a predetermined memory cell arranged in the memory block selected by the decoder provided in the functional block for a usual operation. On the other hand, in a read mode, data written in a predetermined memory cell arranged in the memory block selected by the above decoder is output as read data.

Further, when a test for the memory cell array is carried out, the above circuits formed through the functional block for a usual operation are switched to the circuits formed through the functional block for testing, and the test data is simultaneously written to each of the corresponding memory cells arranged in each of the memory blocks, through the functional block for testing. Thus, in a test mode, it is possible to simultaneously carry out a test for all memory blocks within a relatively short time.

In the semiconductor integrated circuit having a construction such as above, it is necessary to provide a terminal for supplying a signal for switching the operational mode of the memory cell array from the outside, e.g., for switching the memory cell array from a usual mode to a test mode, or vice versa.

However, the number of terminals which can be provided in the package receiving the chip of the semiconductor integrated circuit is limited, and therefore, it is difficult to provide an exclusive terminal in the package for receiving the signal for switching the operational mode of the memory cell array from the outside and thus carry out the test for the memory cell array after the chip has been received in the package, especially when the capacity of the memory cell array has been increased.

Accordingly, it has been proposed to supply an input signal from the outside, this input signal having a potential set to a different value in the test mode from that of the input signal supplied in a usual mode, by using an existing terminal provided in the package (e.g., an address terminal connected to the above decoder for selecting one of the memory blocks), and to switch the operational mode of the memory cell array from a usual mode to a test mode, or vice versa, in accordance with a signal output by a voltage detecting circuit which detects the potential of the input signal.

However, in the conventional voltage detecting circuit, if the input signal having a predetermined potential is supplied from the outside to an external input terminal (e.g., the address terminal connected to the above decoder), a predetermined leak current flows into the external input terminal even when the operational mode of the internal circuit is in the usual mode.

In this connection, in such a semiconductor integrated circuit, the leak current due to the input signal flowing from the outside into the external input terminal of the semiconductor integrated circuit is limited to within, for example, 10 $\mu$A (microamperes), as a rated value.

Such a rated value is usually determined in accordance with a driving ability of the driver circuit for the semiconductor integrated circuit comprising, for example, the dynamic RAM. Namely, considering the actual state in the usual mode of such a semiconductor integrated circuit, a number of semiconductor integrated circuits (about one hundred semiconductor integrated circuits, for example) are often driven in parallel by a common driver circuit.

Therefore, if one hundred semiconductor integrated circuits are driven by the common driver circuit and the value of each leak current flowing from the driver circuit into each external input terminal of the semiconductor integrated circuits exceeds the above rated value (i.e., 10 $\mu$A), the driver circuit must output a current having a total value in the mA (milliampere) range, in order to drive the above one hundred semiconductor integrated circuits.

Therefore, if the leak current flowing from the drive circuit into the external input terminal of the semiconductor integrated circuit exceeds the above rated value (e.g., 10 $\mu$A), a problem arises in that the driving ability of the driver circuit is not sufficient for driving all of the above semiconductor integrated circuits in the usual mode and the possibility of the destruction of transistors provided in, for example, the driver circuit, may arise.

SUMMARY OF THE INVENTION

The present invention has been created to solve this problem, and the main object of the present invention is to suppress the leak current flowing from the driver circuit into the external input terminal of the semiconductor integrated circuit in the usual mode.

To attain the above-mentioned object, according to the present invention, there is provided a semiconductor integrated circuit having first and second power supply lines for receiving a power supply voltage, an external input terminal for receiving an input signal, and a high voltage detection circuit for detecting at the external input terminal a high voltage higher than a predetermined voltage which is higher than the power supply voltage, the high voltage detection circuit comprising:

an input circuit connected to the external input terminal for generating a detection voltage;

a reference voltage generating circuit for generating a reference voltage; and a differential voltage amplifier connected to receive the detection voltage and the reference voltage for amplifying the difference between the detection voltage and the reference voltage, to thereby determine whether the high voltage is applied, the input circuit comprising:

a level shift means connected to the external input terminal for providing the detection voltage;

an impedance means connected between the level shift means and the second power supply line; and a leak current compensating means connected between the first power supply line and the level shift means for allowing a current to flow from the first power supply line through the leak current compensating means and the impedance means to the second power supply line when the high voltage is not applied to the external input terminal.

Further, according to the present invention, there is provided a semiconductor integrated circuit comprising an internal circuit; an external input terminal for receiving an input signal for switching the operational mode of the internal circuit; a differential voltage generator comprising a plurality of first transistors connected in series between the external input terminal and a first power supply line and generating a first voltage from a first node formed by two predetermined adjacent transistors of the first transistors, at least a second transistor connected between a second power supply line and a second node formed by the two predetermined adjacent transistors of the first transistors, and a plurality of third transistors connected in series between the first and second power supply lines and generating a second voltage from a third node formed by two predetermined adjacent transistors of the third transistors; and a differential voltage amplifier connected to the first node and the third node, for amplifying a differential voltage between the first voltage and the second voltage, thereby determining whether the operational mode of the internal circuit is a test mode or a usual mode.

Thus, according to the present invention, the potential of the input signal in which the current begins to flow from the outside into the external input terminal of the semiconductor integrated circuit depends not only on the threshold voltage of the above transistors, but also on the potential of the second power supply line. In other words, no leak current flows from the driver circuit into the external input terminal of the semiconductor integrated circuit, unless the potential of the input signal reaches the value set in the test mode.

As a result, according to the present invention, it is possible to suppress the leak current flowing from the driver circuit into the external input terminal of the semiconductor integrated circuit in the usual mode, and to reduce the driving ability of the driver circuit for driving a number of semiconductor integrated circuits.

DESCRIPTION OF THE PREFERRED EMBODIMENTS

Figure 1A:
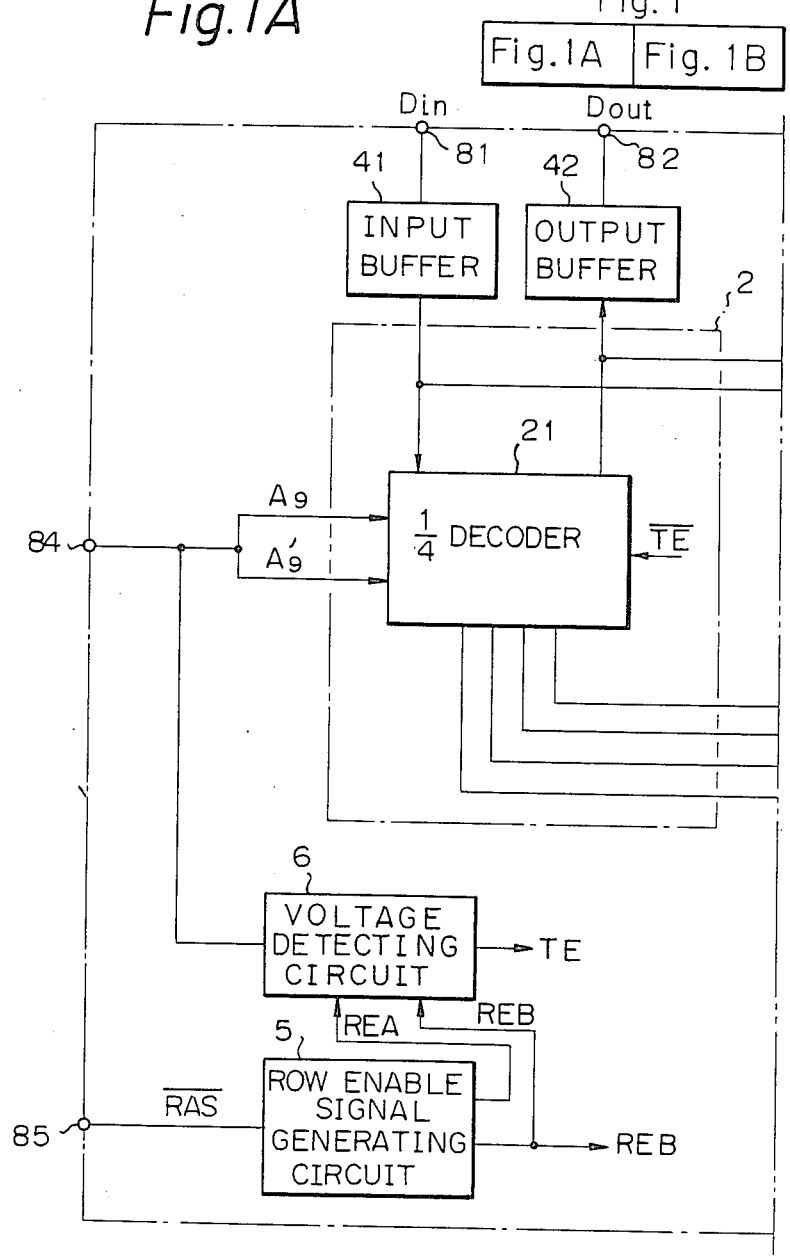
FIG. 1 comprised of FIGS. 1A and 1B is a block diagram illustrating an example of a semiconductor integrated circuit comprising a memory cell array for which a test can be carried out within a comparatively short time.
Figure 1B:
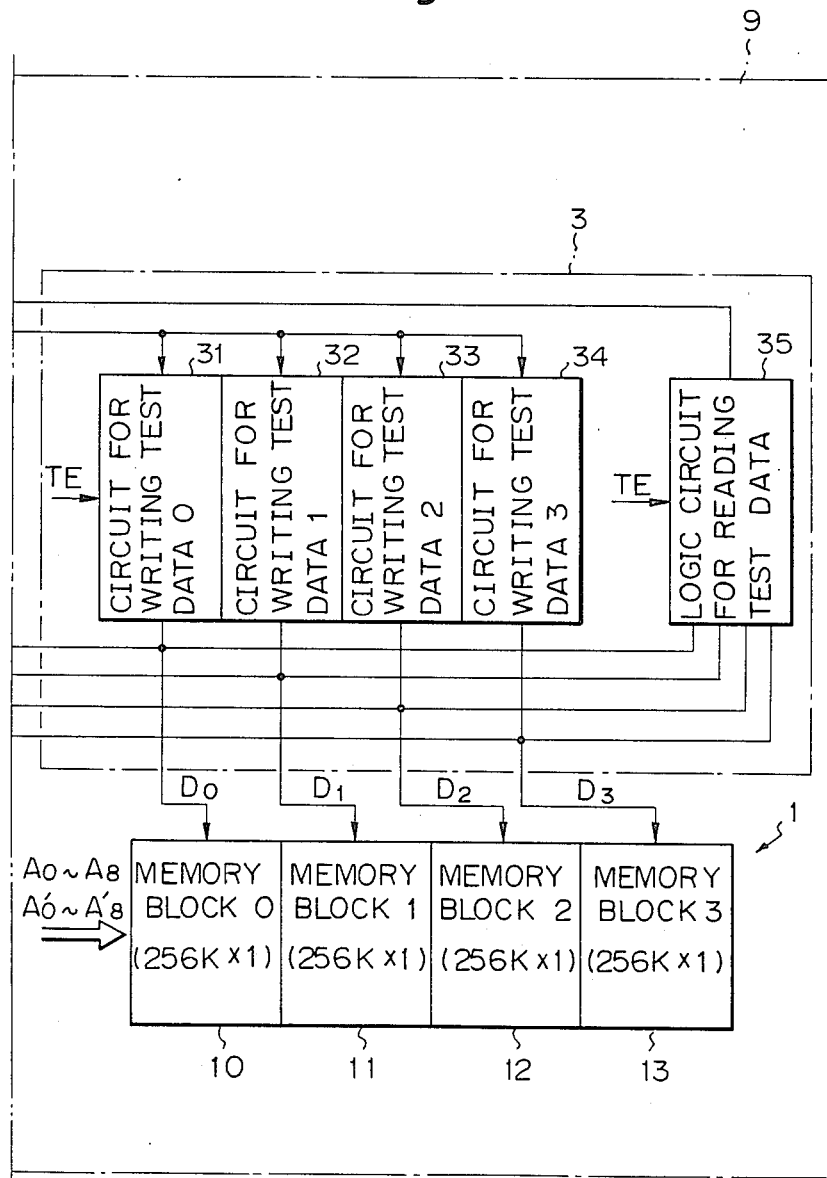

To clarify the background of the present invention, an example of a semiconductor integrated circuit comprising a memory cell array having a large capacity, for which a test can be carried out within a comparatively short time, is shown in FIG. 1.

In FIG. 1, reference numeral 1 is a memory cell array having a capacity of (1 mega words)×(1 bit) comprising four memory blocks 10, 11, 12, and 13, and each block has a capacity of (256 kilo words)×(1 bit). Reference numeral 2 is a functional block for usual operation which functions when the memory cell array operates in a usual mode. The functional block 2 usually comprises a ¼ decoder 21 including an address buffer. A row address signal $A_9$ and a column address signal $A_9'$ are supplied from the outside to the ¼ decoder 21 through an address terminal 84, and the ¼ decoder selects one of four data buses $D_0$ to $D_3$, which are connected, respectively, to four memory blocks 10 to 13 in accordance with the address signals $A_9$ and $A_9'$. Thus, in a write mode, a predetermined write data $D_{IN}$ is written to a predetermined memory cell in the memory block connected to the selected data bus through a data input terminal 81, an input buffer 41, the decoder 21, and the selected data bus. Also, in a read mode, data written in a predetermined memory cell in the memory block connected to the selected data bus is supplied to a data output terminal 82 as read data $D_{OUT}$ through the selected data bus, the decoder 21, and an output buffer 42. In this connection, as is well known, row address signals $A_0$ to $A_8$ and column address signals $A_0'$ to $A_8'$ are supplied to each of the memory blocks 10 to 13 through a decoder (not shown in figures) in order to designate row and column addresses corresponding to a predetermined memory cell arranged in each of the memory blocks 10 to 13, to which the data $D_{IN}$ is written in a write mode, or from which the data $D_{OUT}$ is output in a read mode.

Although the semiconductor integrated circuit shown in FIG. 1 operates as above-mentioned in a usual mode, when a test for the memory cell array 1 is carried out, the circuits formed between the input buffer 41 or the output buffer 42 and each of the memory blocks 10 to 13 are switched from the above circuits formed through the functional block 2 for usual operation to the other circuits formed through the functional block 3 for testing, as described below. In this connection, reference numeral 9 is a chip, and the above memory cell array 1, the functional block 2 for usual operation, and the functional block 3 for testing are arranged on the chip 9.

The functional block 3 for testing comprises four circuits 31, 32, 33, and 34 for writing test data to each of the memory blocks 10 to 13, and a logic circuit 35 for logically reading test data output from each of the memory blocks 10 to 13. Each of the circuits 31 to 34 amplifies test data input from the input buffer 41, and then supplies the test data to each of the corresponding memory cells arranged in each of the memory blocks 10 to 13 by designating the row address signals $A_0$ to $A_8$ and the column address signals $A_0'$ to $A_8'$ supplied to each of the memory blocks. Thus, in a test mode, it is possible to simultaneously test the four memory blocks 10 to 13 by using the above functional block 3 for testing.

The operation of the whole circuit in a test mode will be now explained in more detail. When the test for the memory cell array is carried out, test data input through the data input terminal 81 and the input buffer 41 is simultaneously supplied to each of the memory blocks 10 to 13 through each of the circuits 31 to 34, and the test data is simultaneously written to each of the corresponding memory cells (in this case, four memory cells) arranged in each of the memory blocks 10 to 13. Then, the test data written in each of the corresponding memory cells arranged in each of the memory blocks 10 to 13 is supplied to the logic circuit 35, which detects whether or not the voltage levels of the test data (in this case, four sets of data) supplied from each of the corresponding memory cells arranged in each of the memory blocks 10 to 13 all coincide. Thus, the logic circuit 35 outputs a predetermined signal only when the logic circuit 35 detects that the voltage levels of the above four data all coincide, namely all of the above corresponding memory cells are normal. In this way, all of the corresponding memory cells arranged in each of the memory blocks 10 to 13 are successively tested to determine whether the above memory cells are normal or defective. According to the above construction, as the corresponding memory cells (in this case, four memory cells) arranged in each of the memory blocks are simultaneously tested in the test mode, it is possible to shorten the test time (in this case, to shorten to one fourth) compared with the case wherein each of the above corresponding memory cells are tested one by one at different times. In this connection, in such a memory cell array, as it is divided into several memory blocks, it is possible to provide a different function to each of the memory blocks 10 to 13 when these memory blocks are operated in a usual mode. The output signal of the logic circuit 35 is supplied to the output buffer 42, and thus the test for each of the above corresponding memory cells is carried out in accordance with the signal $D_{OUT}$ output from the data output terminal 82 through the logic circuit 35 and the output buffer 42, when the test data written in each of the above corresponding memory cells is supplied from each of the memory blocks 10 to 13 to the logic circuit 35 in the test mode.

In such a semiconductor integrated circuit, it is necessary to provide a terminal through which an input signal for switching the operational mode of the internal circuit is supplied from the outside, in order to switch the memory cell array from a usual mode to a test mode, or vice versa.

However, the number of terminals (pins) which can be provided in the package receiving the chip of the semiconductor integrated circuit comprising the memory cell array is limited to a predetermined number, and therefore, it is difficult to provide an exclusive terminal in the package to which the above signal for switching the operational mode of the memory cell array can be supplied from the outside, in addition to the existing terminals, in order to carry out the test for the memory cell array after the chip has been received in the package, especially when the capacity of the memory cell array becomes large.

Therefore, it has been proposed to supply an input signal from the outside, the potential of which is set to a different value in the test mode from that of the input signal supplied in a usual mode, through the existing terminal provided in the package (e.g., the address terminal 84 connected to the decoder 21), and to switch the operational mode of the memory cell array from the usual mode to the test mode (namely, from the circuit formed through the functional block 2 to the circuit formed through the functional block 3), or vice versa, in accordance with an output signal TE of a voltage detecting circuit 6, which detects the potential of the input signal supplied through the terminal 84.

Further, in the semiconductor integrated circuit shown in FIG. 1, a row address strobe signal $\overline{RAS}$ is supplied from the outside to a row enable signal generating circuit 5 through a terminal 85, and a row enable signal REB is output from the circuit 5. The row enable signal REB is supplied to the voltage detecting circuit 6 and several other internal circuits. A signal REA output from the circuit 5 is also supplied to the voltage detecting circuit 6, as described below in detail.

The row address strobe signal $\overline{RAS}$ is used not only as a timing control signal for entering external address signals but also as a chip select signal for controlling and defining an active period of the device, as is well known in the art. The row enable signal REB is used to activate various internal circuits, accordingly.

When the potential of the signal REB changes from low level to high level, (namely, when the chip 9 is selected), the voltage detecting circuit 6 is triggered so as to be able to detect the potential of the input signal supplied from the outside through the terminal 84, and when the circuit 6 detects that the potential of the input signal is set to a predetermined different value from that of the input signal (e.g., address signal) supplied in the usual mode, the circuit 6 generates the output signal TE for switching the operational mode of the memory cell array 1, and the memory cell array 1 is switched from the usual mode to a test mode, or vice versa, in accordance with the potential of the output signal TE.

The row address strobe signal $\overline{RAS}$ is supplied from the outside to the circuit 5 through the terminal 85 at a TTL level (namely, having a predetermined low level lower than 0.8 volts, and having a predetermined high level higher than 2.4 volts) and thereby, the potential of the row enable signal REB obtained from the outside of the circuit 5 becomes $V_{CC}$ (5 volts, for example) and $V_{SS}$ (0 volt, for example), when the voltage level of the row address strobe signal $\overline{RAS}$ is low and high, respectively. Then, the row enable signal REB obtained as above-mentioned is supplied to several internal circuits besides the voltage detecting circuit 6 in order to operate the memory cell array 1 (address buffer, for example), and the operation for writing data to a predetermined memory cell or for reading data from a predetermined memory cell is performed every time the voltage level of the row enable signal REB becomes high.

Also, the address terminal 84 connected to the decoder 21, for example, is used as the terminal through which the input signal is supplied to the voltage detecting circuit 6. Thus, the address terminal 84 supplies the row and column address signals A9 and A9' to the decoder 21 when the memory cell array 1 is in the usual mode, and the terminal 84 is also used as the terminal through which the input signal having the different potential value from that of the address signals A9 and A9' is supplied in the test mode.

Figure 2A:
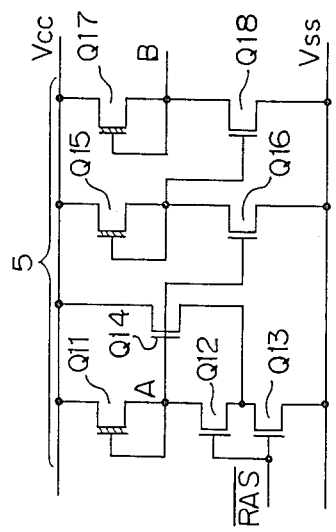
FIG. 2A and FIG. 2B show a detailed example of a conventional row enable signal generating circuit and a conventional voltage detecting circuit used in the semiconductor integrated circuit shown in FIG. 1, respectively.
Figure 2B:
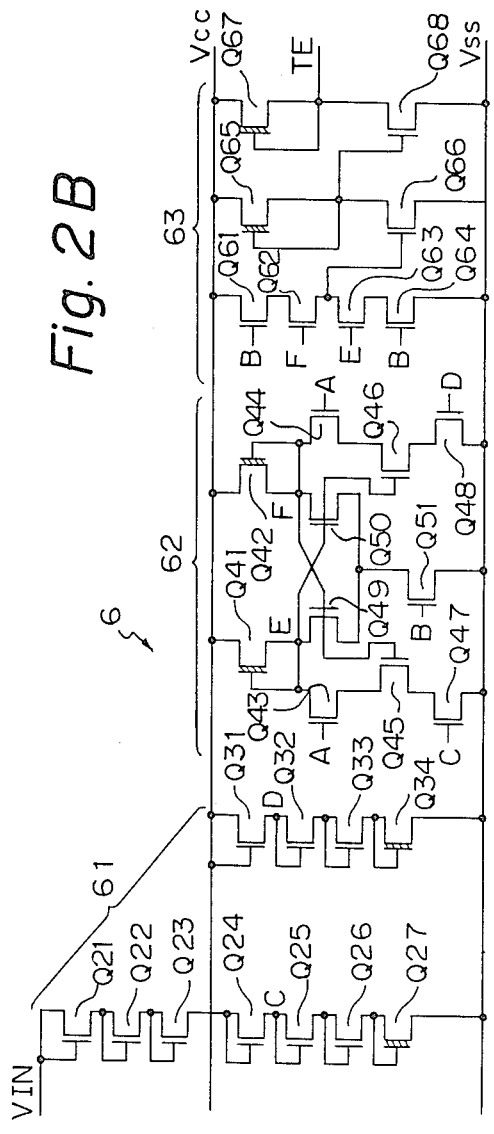

FIG. 2A and FIG. 2B show a detailed example of a conventional row enable signal generating circuit 5 and a conventional voltage detecting circuit 6 used in the semiconductor integrated circuit shown in FIG. 1, respectively. In FIG. 2A, symbols Q11, Q15, and Q17 denote a depletion type transistor, shown by adding oblique lines under a gate connected to a drain in common, and symbols Q12, Q13, Q14, Q16, and Q18 denote an enhancement type transistor.

When the potential of the row address strobe signal $\overline{RAS}$ supplied from the outside through the terminal 85 changes from high level to low level, the transistors Q12 and Q13 are turned OFF, and the potential of the node A formed between the transistors Q11 and Q12 becomes high level. Thus, a first clock signal is generated from the node A in accordance with the change of the potential level of the signal $\overline{RAS}$.

Further, when the potential of the node A becomes high level, the transistors Q14 and Q16 are turned ON and the transistor Q18 is turned OFF, and the potential of the node B formed between the transistors Q17 and Q18 also becomes high level. Thus, a second clock signal is generated from the node B at a timing a little later than that of the first clock signal in accordance with the change of the potential level of the signal $\overline{RAS}$.

In this connection, the first clock signal generated from the node A and the second clock signal generated from the node B are supplied to the voltage detecting circuit 6 as the signals REA and REB, respectively, as shown in FIG. 1.

As above-mentioned, the second clock signal, for example, is also used as the row enable signal REB, as shown in FIG. 1. Thus, the above row enable signal generating circuit 5 is also used as a control circuit for a differential voltage amplifier provided in the voltage detecting circuit 6, as described below in detail.

Next, in the voltage detecting circuit 6 shown in FIG. 2B, reference numerals 61, 62, and 63 denote a differential voltage generator, a differential voltage amplifier, and a output control circuit, respectively.

The differential voltage generator 61 comprises a plurality of transistors Q21 to Q27, for example, connected in series between an external input terminal (for example, the terminal 84 shown in FIG. 1) and a power supply line having the earth potential $V_{SS}$, and, for example, a plurality of transistors Q31 to Q34 connected in series between a power supply line having a predetermined positive potential $V_{CC}$ and the above power supply line having the earth potential $V_{SS}$. Among the above plurality of transistors, the transistors Q21 to Q26 and Q31 to Q33 are enhancement type transistors having a drain and a gate connected in common, and the transistors Q27 and Q34 are depletion type transistors having a drain and a gate connected in common.

The differential voltage amplifier 62 comprises a plurality of transistors Q41 to Q51, and among the above plurality of transistors, the transistors Q41 and Q42 are depletion type transistors having a drain and a gate connected in common, and the transistors Q43 to Q51 are enhancement type transistors.

The node A in the above circuit 5 is connected to each gate of the transistors Q43 and Q44, and thus the above clock signal REA is supplied to each gate of transistors Q43 and Q44. Also, the node B in the above circuit 5 is connected to a gate of the transistor Q51, and thus the above delayed clock signal REB is supplied to the gate of the transistor Q51.

Also, a node C formed between the transistors Q24 and Q25 is connected to a gate of the transistor Q47, and thus the potential of the node C (a detection voltage) is supplied to the gate of the transistor Q47. Further, a node D formed between the transistors Q31 and Q32 is connected to a gate of the transistor Q48, and thus the potential of the node D (a reference voltage) is supplied to the gate of the transistor Q48. A node E formed between the transistors Q41 and Q49 is connected to each gate of the transistors Q50 and Q46, and a node F formed between the transistors Q42 and Q50 is connected to each gate of the transistors Q49 and Q45. Thus, the differential voltage amplifier forms a flip-flop circuit.

When the input signal having a potential VIN is supplied to the external input terminal (e.g., the terminal 84 shown in FIG. 1), the potential of the node C becomes (VIN $-4$ $V_{th}$), where $V_{th}$ is each threshold voltage of the transistors Q21 to Q24. On the other hand, the potential of the node D becomes ($V_{CC}-V_{th}$), where $V_{th}$ is a threshold voltage of the transistor Q31.

Therefore, the potential of the node D is determined irrespective of the change of the potential VIN of the input signal. On the other hand, the potential of the node C depends on the change of the potential VIN of the input signal.

Therefore, in the above example, the potential VIN of the input signal for switching the operational mode of the internal circuit is set to a value higher than ($V_{CC}+3$ $V_{th}$) in the test mode, and thus the potential of the node C becomes higher than that of the node D (i.e., $V_{CC}-V_{th}$). On the other hand, in the usual mode, the above potential VIN usually becomes lower than $V_{CC}$, and is determined by the potential level (e.g., TTL level) of the address signal supplied, for example, to the terminal 84. Thus, the potential of the node C is pulled down to a value lower than that of the node D. In this connection, the transistors Q25 to Q27 are connected as a leak path between the node C and the power supply line having the earth potential $V_{SS}$, through which path the potential of the node C is pulled down from high level to low level when the operational mode of the internal circuit is switched from a test mode to a usual mode.

Next, each potential of the nodes C and D is supplied to each gate of the transistors Q47 and Q48, respectively, and the state of the flip-flop circuit provided in the differential voltage amplifier 62 is determined in accordance with the relationship between the potentials of the nodes C and D. Therefore, it is possible to determine whether the operational mode of the internal circuit is the test mode or usual mode, in accordance with the state of the flip-flop circuit.

Namely, if the potential VIN of the input signal becomes higher than the above ($V_{CC}+3 V_{th}$), the potential of the node C becomes higher than that of the node D. Thus, when the potential of the first clock signal REA generated from the node A becomes high level, a predetermined large current flows through the transistors Q41, Q43, Q45, and Q47. As a result, the potential of the node E tends to become low level, and the potential of the node F tends to become high level. Thus, the differential voltage due to the different potentials of the nodes E and F is produced in the flip-flop circuit.

Then, when the potential of the second delayed clock signal REB becomes high level, the flip-flop circuit is triggered and brought to the active state, in which the transistors Q49 and Q51 are turned ON and the transistor Q50 is turned OFF. Thus, the flip-flop circuit is securely latched in the state in which each potential of the nodes E and F is set to a low level and high level, respectively, as long as the potential of the node C is higher than that of the node D in the test mode, irrespective of the change of the potential of the clock signal REB.

Further, the output control circuit 63 comprises a plurality of transistors Q61 to Q68, and among the above plurality of transistors Q61 to Q68, the transistors Q65 and Q67 are depletion type transistors having a drain and a gate connected in common, and the transistors Q61 to Q64, Q66, and Q68 are enhancement type transistors.

Thus, when each potential of the nodes E and F becomes low level and high level, respectively, in the test mode, the transistor Q62 is turned ON and the transistor Q63 is turned OFF. Then, the transistor Q66 is turned ON and the transistor Q68 is turned OFF. As a result, the potential of the output signal TE obtained from the node between the transistors Q67 and Q68 becomes high level in the test mode.

Conversely, in the usual mode, the flip-flop circuit is latched in the state in which each potential of the nodes E and F becomes high level and low level, respectively, due to the potential of the node C, which is lower than that of the node D. As a result, the potential of the above output signal TE becomes low level in the usual mode. Therefore, it is possible to switch the operational mode of the internal circuit from the usual mode to the test mode, or vice versa, in accordance with the potential of the output signal TE.

However, in the differential voltage generator provided in the conventional voltage detecting circuit as shown in FIG. 2B, if the potential VIN of the input signal supplied to the external input terminal reaches a predetermined value (a value higher than 6 $V_{th}$ in this example, where $V_{th}$ is a threshold voltage of each of the transistors Q21 and Q26), a predetermined leak current flows through the transistors Q21 to Q27, irrespective of the relationship between the potential VIN of the input signal and the potential $V_{CC}$ of the positive side power supply line. In other words, even if the potential VIN of the input signal is lower than a normal voltage for selecting the test mode (e.g., ($V_{CC}+3 V_{th}$), in the above example) a predetermined leak current flows through the transistors Q21 to Q27. In this connection, it is necessary to provide not only transistors Q21 to Q24 between the external input terminal and the node C, but also transistors Q25 to Q27 between the node C and the negative side power supply line having the potential $V_{SS}$, to pull down the potential of the node C to a value lower than that of the node D, when the operational mode of the internal circuit is switched from the test mode to the usual mode as above-mentioned.

As a result, although, in the usual mode, a predetermined potential lower than $V_{CC}$ (e.g., the potential of the address signal having the TTL level) is supplied to the external input terminal, if the above potential supplied in the usual mode is higher than 6 $V_{th}$, in the above example, where the value of the above $V_{th}$ is varied in accordance with the variation of the characteristics of the transistors Q21 to Q26, a predetermined current higher than 10 μA (microamperes), for example, flows through the transistors Q21 to Q27 in the usual mode.

However, in such a semiconductor integrated circuit, the leak current due to the input signal flowing from the outside into the external input terminal of the semiconductor integrated circuit is limited to, for example, within 10 μA, as a rated value.

Such a rated value is usually determined in accordance with the driving ability of the driver circuit for the semiconductor integrated circuit comprising, for example, the dynamic RAM. Namely, considering the actual state in the usual mode of such a semiconductor integrated circuit, a number of semiconductor integrated circuits (about one hundred semiconductor integrated circuits, for example) are often driven in parallel by a common driver circuit. Therefore, if one hundred semiconductor integrated circuits are driven by the common driver circuit and the value of each leak current flowing from the driver circuit into each external input terminal of the above semiconductor integrated circuits exceeds the above rated value (i.e., 10 μA), the driver circuit must output a current having a total value in the mA (milliampere) range, in order to drive the above one hundred semiconductor integrated circuits.

Therefore, if the leak current flowing from the driver circuit into the external input terminal of the semiconductor integrated circuit exceeds the above rated value (e.g., 10 μA), a problem arises in that the driving ability of the driver circuit is not sufficient for driving all of the above semiconductor integrated circuits in the usual mode and the possibility of the destruction of transistors provided in the driver circuit, for example, may arise.

The present invention has been created in order to solve such a problem, and the main object of the present invention is to suppress the leak current flowing from the driver circuit into the external input terminal of the semiconductor integrated circuit in the usual mode.

Figure 3A:
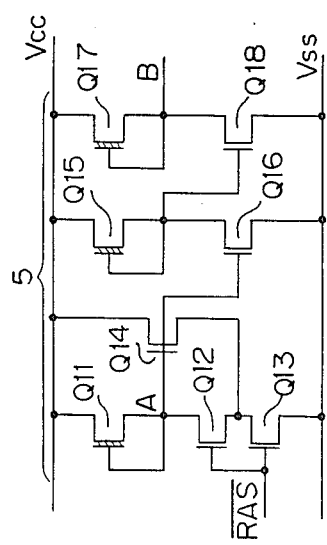
FIG. 3A and FIG. 3B show a detailed circuit illustrating one embodiment of the row enable signal generating circuit and the voltage detecting circuit according to the present invention, as an alternative to the circuits shown in FIG. 2A and FIG. 2B, respectively.
Figure 3B:
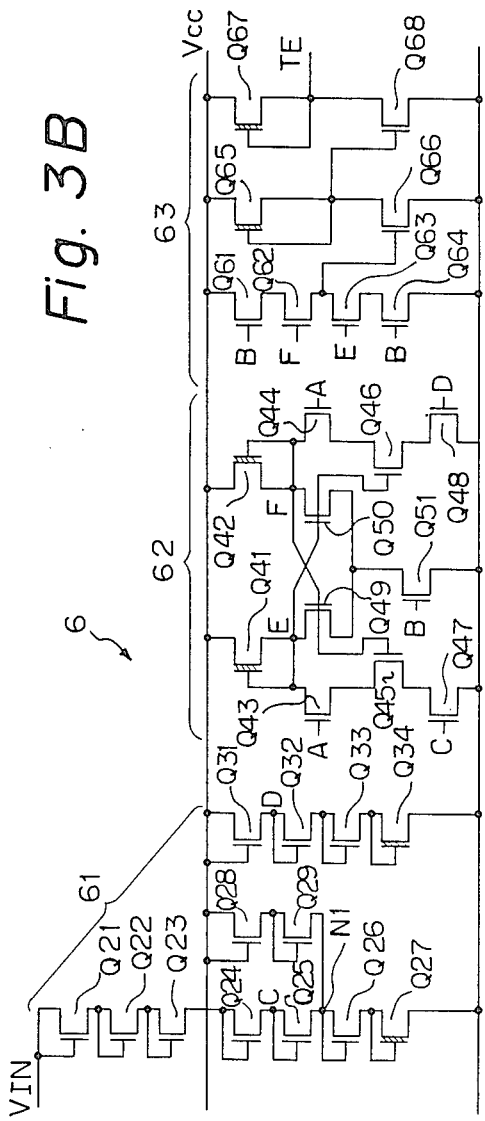

FIG. 3A and FIG. 3B show a detailed circuit illustrating one embodiment of the row enable signal generating circuit 5 and the voltage detecting circuit (high voltage detection circuit) 6 according to the present invention, respectively. The construction of the circuit 5 shown in FIG. 3A is the same as that of the circuit shown in FIG. 2A. Also, in FIG. 3B, members identical to those of FIG. 2B are represented by the same reference numerals or characters.

The difference between the voltage detecting circuit 6 shown in FIG. 3B and the voltage detecting circuit 6 shown in FIG. 2B is that, in the differential voltage generator 61 provided in the voltage detecting circuit according to the present invention shown in FIG. 3B, a predetermined number of transistors (e.g., two transistors Q28 and Q29 connected in series, as shown in FIG. 3B) are additionally connected as a leak current compensating means between the power supply line having the potential $V_{CC}$ and a node N1 formed by two predetermined adjacent transistors of the transistors Q21 to Q27. In this connection, in the circuit 6 shown in FIG. 3B, the node formed by the two transistors Q25 and Q26 is selected as the node N1. Also, the transistors Q28 and Q29 are enhancement type transistors having a drain and a gate connected in common. The transistors Q21 to Q25 function as a level shift means, and the transistors Q26 and Q27 function as an impedance means.

Thus, in the circuit 6 shown in FIG. 3B, the potential of the node N1 becomes ($V_{CC} - 2V_{th}$), where $V_{th}$ is each threshold voltage of the transistors Q28 and Q29.

As a result, even when the input signal having the potential VIN is supplied to the differential voltage generator 61 through the external input terminal, no current begins to flow through the transistors Q21 to Q27, unless the potential VIN becomes higher than the value of ($V_{CC} - 2V_{th} + 5V_{th}$), i.e., the value of ($V_{CC} + 3V_{th}$). In other words, no current begins to flow through the transistors Q21 to Q27, unless the potential VIN of the input signal for switching the operational mode of the internal circuit reaches the value set in the test mode, i.e., the value higher than ($V_{CC} + 3V_{th}$) in this embodiment.

Therefore, when the operational mode of the internal circuit is in the usual mode and the potential of the input signal becomes lower than $V_{CC}$ (e.g., the potential of the address signal having the TTL level potential), no leak current flows from the driver circuit into the external input terminal. In this connection, as a predetermined current always flows from the power supply line $V_{CC}$ to the power supply line $V_{SS}$ through the transistors Q28, Q29, Q26, and Q27, it is possible to lower the potential of the node C when the operational mode is switched from the test mode to the usual mode.

Although a predetermined current flows from the external input terminal through the transistors Q21 to Q27 when the operational mode of the internal circuit is in the test mode, this does not cause the above-mentioned problem, because the test for such a semiconductor integrated circuit is successively carried out one by one for each device (not in parallel) before forwarding.

Figure 4:
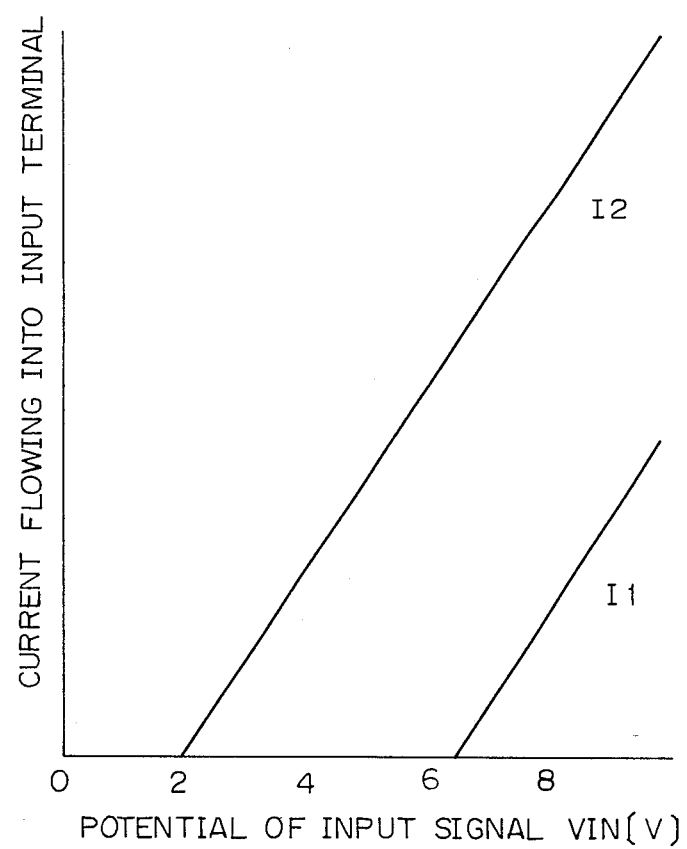
FIG. 4 shows an example of characteristics corresponding to the relationship between the potential of the input signal and the current flowing from the outside into the external input terminal in both the voltage detecting circuit according to the present invention and the conventional voltage detecting circuit; and, FIG. 5A and FIG. 5B are schematic timing diagrams explaining the operation of the voltage detecting circuit according to the present invention.

FIG. 4 shows an example of characteristics corresponding to the relationship between the potential VIN of the input signal (corresponding to the abscissa) and the current flowing into the external input terminal (corresponding to the ordinate) in both the differential voltage generator according to the present invention (as shown in FIG. 3B) and the conventional differential voltage generator (as shown in FIG. 2B). In FIG. 4, a line I1 shows an example of the characteristic according to one embodiment of the present invention as shown in FIG. 3B, and a line I2 shows an example of the characteristic according to the conventional generator as shown in FIG. 2B. In this connection, the power supply potential $V_{CC}$ is set to 5 volts and each threshold voltage $V_{th}$ of the enhancement type transistors is set to 0.5 volts.

As shown in FIG. 4, according to one embodiment of the present invention, no current flows into the external input terminal unless the above potential VIN becomes higher than about 6.5 volts, i.e., a higher value than ($V_{CC} + 3V_{th}$) set in the test mode.

Conversely, in the conventional differential voltage generator, the current begins to flow into the external input terminal when the above potential VIN becomes, for example, about 2 volts.

FIG. 5A and FIG. 5B are schematic timing diagrams explaining the operation of the voltage detecting circuit according to the present invention.

As above-mentioned, when the potential of the row address strobe signal $\overline{RAS}$ supplied from the outside through the terminal 85 changes from high level to low level (namely, the potential of the row enable signal changes from low level to high level), the flip-flop circuit provided in the voltage detecting circuit 6 is triggered and brought to the active state.

At that time, if the potential VIN of the input signal is a predetermined level set in the usual mode (the level is usually equal to the above-mentioned TTL level and usually lower than the $V_{CC}$ level, as shown in FIG. 5A), the potential of the output signal TE obtained from the voltage detecting circuit 6 becomes low (namely, $V_{SS}$ level), as shown in FIG. 5B.

Although the potential of the row address strobe signal $\overline{RAS}$ changes from low level to high level (namely, the potential of the row enable signal changes from high level to low level), the potential of the output signal TE is latched in the above low level, as shown in the period of the usual mode in FIG. 5B.

Next, when the potential of the signal $\overline{RAS}$ changes from high level to low level, if the potential VIN of the input signal is a predetermined value set in the test mode (e.g., the value higher than the above ($V_{CC} + 3V_{th}$), as shown in FIG. 5A), the potential of the output signal TE becomes high (namely, nearly equal to $V_{CC}$ level), as shown in FIG. 5B. Thus, the operational mode of the internal circuit (e.g., the memory cell array 1) is switched from the usual mode to the test mode, as shown in the switching mode period in FIG. 5B.

Thus, subsequently, although the potential of the signal $\overline{RAS}$ becomes high, the potential of the output signal TE is maintained at the high level, and then, when the potential of the signal $\overline{RAS}$ changes from high level to low level, the operational mode of the internal circuit is shifted to the test mode, as shown in the test mode period in FIG. 5B.

Although the potential of the signal RAS cyclically changes from low level to high level, the potential of the output signal TE is latched in the above high level, as long as the potential VIN of the input signal maintains the above value set in the test mode.

Thus, as long as the potential of the input signal maintains the value set in the test mode, test data is simultaneously written or read, to or from each of the corresponding memory cells provided in the memory blocks 10 to 13, each time the potential of the signal $\overline{RAS}$ becomes low and the memory cell array becomes active.

Although, in the above description, the case wherein the operational mode of the memory cell array is switched from a usual mode to a test mode is exemplified, it is also possible to switch the operational mode from the test mode to the usual mode in accordance with the change of the potential of the input signal by triggering the voltage detecting circuit 6 when the potential of the signal $\overline{RAS}$ changes from high level to low level.

Also, in the above embodiment, although the input signal is supplied from the outside to the voltage detecting circuit 6 through the address terminal 84 connected to the decoder 21 provided in the functional block 2 for usual operation, other terminals such as data input terminal 81 or data output terminal 82 also may be used as the terminal for supplying the input signal, by intermittently supplying the input signal in synchronism with the predetermined edge (the falling edge of the potential, for example) of the signal $\overline{RAS}$.

As described above, according to the present invention, the potential VIN of the input signal in which the current begins to flow from the outside into the external input terminal of the semiconductor integrated circuit depends not only on the above threshold voltage $V_{th}$, but also on the power supply potential $V_{CC}$. In other words, no leak current flows from the driver circuit into the external input terminal of the semiconductor integrated circuit, unless the potential VIN of the input signal reaches the value set in the test mode, e.g., the value higher than ($V_{CC}+3\ V_{th}$).

As a result, it is possible to suppress the leak current flowing from the driver circuit into the external input terminal of the semiconductor integrated circuit in the usual mode, and to reduce the driving ability of the driver circuit for driving a number of the semiconductor integrated circuits.

We claim:

1. A semiconductor integrated circuit having first and second power supply lines for receiving a power supply voltage, an external input terminal for receiving an input signal, and a high voltage detection circuit for detecting at said external input terminal a high voltage higher than a predetermined voltage which is higher than said power supply voltage, said high voltage detection circuit comprising:
    an input circuit connected to said external input terminal for generating a detection voltage;
    a reference voltage generating circuit for generating a reference voltage; and
    a differential voltage amplifier connected to receive said detection voltage and said reference voltage for amplifying the difference between said detection voltage and said reference voltage, to thereby determine whether said high voltage is applied,
    said input circuit comprising:
        a level shift means connected to said external input terminal for providing said detection voltage;
        an impedance means connected between said level shift means and said second power supply line; and
        a leak current compensating means connected between said first power supply line and said level shift means for allowing a current to flow from said first power supply line through said leak current compensating means and said impedance means to said second power supply line when said high voltage is not applied to said external input terminal.

2. A semiconductor integrated circuit comprising:
    an internal circuit;
    an external input terminal for receiving an input signal for switching the operational mode of said internal circuit;
    a differential voltage generator comprising:
        a plurality of first transistors connected in series between said external input terminal and a first power supply line and generating a first voltage from a first node formed by two predetermined adjacent transistors of said first transistors,
        at least a second transistor connected between a second power supply line and a second node formed by two predetermined adjacent transistors of said first transistors, and
        a plurality of third transistors connected in series between said first and second power supply lines and generating a second voltage from a third node formed by two predetermined adjacent transistors of said third transistors; and
    a differential voltage amplifier connected to said first node and said third node, for amplifying a differential voltage between said first voltage and said second voltage and thereby determining whether the operational mode of said internal circuit is a test mode or a usual mode.

3. A semiconductor integrated circuit according to claim 2, wherein each of said first transistors, said second transistor, and said third transistors is an enhancement type transistor having a drain and a gate connected in common.

4. A semiconductor integrated circuit according to claim 2, further comprising a control circuit for said differential voltage amplifier generating a first clock signal and a second delayed clock signal, wherein said differential voltage amplifier comprises a flip-flop circuit to which said first clock signal and said second delayed clock signal are supplied, the state of said flip-flop circuit is determined in accordance with said first voltage and said second voltage when said first clock signal becomes a predetermined potential level, and said flip-flop circuit is triggered and latched when said second delayed clock signal becomes a predetermined potential level.

5. A semiconductor integrated circuit according to claim 2, wherein the potential of said input terminal becomes higher than that of said second power supply line in the test mode.

6. A semiconductor integrated circuit according to claim 2, wherein the potential of said first node becomes higher than that of said third node in the test mode.

7. A semiconductor integrated circuit according to claim 2, wherein the potential of said first node depends on a change of the potential level of said input signal.

8. A semiconductor integrated circuit according to claim 2, wherein the potentials of said second node and said third node are determined in accordance with a potential level of said second power supply line.

9. A semiconductor integrated circuit according to claim 2, wherein a potential of said input terminal becomes lower than that of said second power supply line in the usual mode.

10. A semiconductor integrated circuit according to claim 2, wherein a potential of said first node becomes lower than that of said third node in the usual mode.

11. A semiconductor integrated circuit according to claim 2, wherein said input terminal is used as an address terminal in the usual mode.

12. A semiconductor integrated circuit according to claim 2, wherein said input terminal is used as a data input terminal and data output terminal in the usual mode.

13. A semiconductor integrated circuit according to claim 2, wherein said clock signal is used as a row enable signal.

* * * * *